(12) United States Patent
Avanzino et al.

(10) Patent No.: US 7,220,642 B2
(45) Date of Patent: May 22, 2007

(54) PROTECTION OF ACTIVE LAYERS OF MEMORY CELLS DURING PROCESSING OF OTHER ELEMENTS

(75) Inventors: Steven Avanzino, Cupertino, CA (US); Igor Sokolik, East Boston, MA (US); Suzette Pangrle, Cupertino, CA (US); Nicholas H. Tripsas, San Jose, CA (US); Jeffrey Shields, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/987,262

(22) Filed: Nov. 12, 2004

(65) Prior Publication Data

US 2006/0102887 A1    May 18, 2006

(51) Int. Cl.
*H01L 21/336* (2006.01)
(52) U.S. Cl. .............................. 438/257; 257/E21.689
(58) Field of Classification Search .................... 438/5, 438/7, 10–11, 14, 16–18, 22–24, 29, 31, 34–36, 438/128–130, 149, 484, 538
See application file for complete search history.

(56) References Cited

U.S. PATENT DOCUMENTS

| 6,420,232 | B1 * | 7/2002 | Wu ........................ 438/257 |
| 6,717,215 | B2 | 4/2004 | Fricke et al. .............. 257/347 |
| 6,720,232 | B1 | 4/2004 | Tu et al. ..................... 438/396 |
| 6,759,282 | B2 * | 7/2004 | Campbell et al. ........... 438/149 |
| 6,787,458 | B1 | 9/2004 | Tripsas et al. .............. 438/652 |
| 6,818,508 | B2 | 11/2004 | Shimizu et al. ............. 438/257 |
| 6,858,442 | B2 * | 2/2005 | Hilliger et al. ................. 438/3 |
| 6,936,549 | B2 * | 8/2005 | Sandhu et al. .............. 438/778 |
| 2003/0143856 | A1 * | 7/2003 | Givens et al. .............. 438/710 |
| 2004/0197996 | A1 * | 10/2004 | Chen et al. .................. 438/259 |
| 2005/0250316 | A1 * | 11/2005 | Choi et al. .................. 438/637 |
| 2006/0043458 | A1 * | 3/2006 | Rudeck ....................... 257/315 |
| 2006/0088947 | A1 * | 4/2006 | Lien et al. ....................... 438/3 |

FOREIGN PATENT DOCUMENTS

WO    WO 2004/042737    5/2004

* cited by examiner

*Primary Examiner*—Walter Lindsay, Jr.
*Assistant Examiner*—Andre' Stevenson (57) ABSTRACT

A method of fabricating an electronic structure by providing a conductive layer, providing a dielectric layer over the conductive layer, providing first and second openings through the dielectric layer, providing first and second conductive bodies in the first and second openings respectively and in contact with the conductive layer, providing a memory structure over the first conductive body, providing a protective element over the memory structure, and undertaking processing on the second conductive body.

15 Claims, 10 Drawing Sheets

PROTECTION OF ACTIVE LAYERS OF MEMORY CELLS DURING PROCESSING OF OTHER ELEMENTS

BACKGROUND OF THE INVENTION

1. Technical Field

This invention relates generally to memory technology, and more particularly, to the protection of the active layer of a memory cell during processing steps undertaken on other elements, for example, copper vias.

2. Background Art

Generally, memory devices associated with computers and other electronic devices are employed to store and maintain information for the operation thereof. Typically, such a memory device includes an array of memory cells, wherein each memory cell can be accessed for programming, erasing, and reading thereof. Each memory cell maintains information in an "off" state or an "on" state, also referred to as "0" and "1" respectively, which can be read during the reading step of that memory cell.

Figure 1:
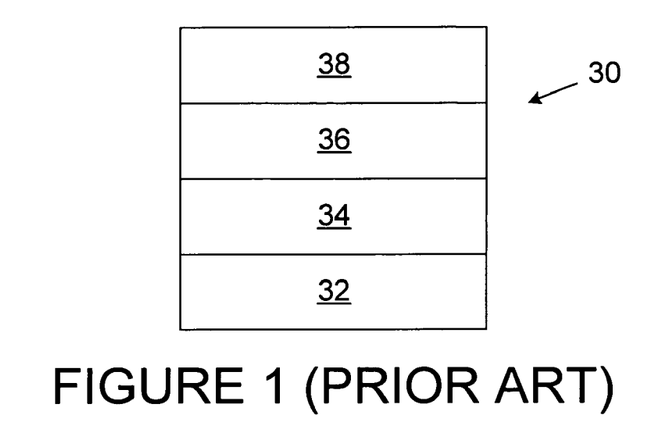
FIG. 1 is a cross-sectional view of a memory cell.

As such electronic devices continue to be developed and improved, the amount of information required to be stored and maintained continues to increase. FIG. 1 illustrates a type of memory cell 30 which includes advantageous characteristics for meeting these needs. The memory cell 30 includes, for example, an electrode 32, a superionic layer 34 such as $Cu_2S$ on the electrode 32, an active layer 36 such as $Cu_2O$ or various polymers on the $Cu_2S$ layer 34, and an electrode 38 on the active layer 36. Initially, assuming that the memory cell 30 is unprogrammed, in order to program the memory cell 30, a negative voltage is applied to the electrode 38, while the electrode 32 is held at ground, so that an electrical potential $V_{pg}$ (the "programming" electrical potential) is applied across the memory cell 30 from a higher to a lower potential in the direction from electrode 32 to electrode 38. This potential is sufficient to cause copper ions to be attracted from the superionic layer 34 toward the electrode 38 and into the active layer 36, causing the active layer 36 (and the overall memory cell 30) to be in a low-resistance or conductive state. Upon removal of such potential, the copper ions drawn into the active layer 36 during the programming step remain therein, so that the active layer 36 (and memory cell 30) remain in a conductive or low-resistance state.

In order to erase the memory cell, a positive voltage is applied to the electrode 38, while the electrode 32 is held at ground, so that an electrical potential $V_{er}$ is applied across the memory cell 30 from a higher to a lower electrical potential in the reverse direction. This potential causes current to flow through the memory cell in the reverse direction, and is sufficient to cause copper ions to be repelled from the active layer 36 toward the electrode 32 and into the superionic layer 34, in turn causing the active layer 36 (and the overall memory cell 30) to be in a high-resistance or substantially non-conductive state. This state remains upon removal of such potential from the memory cell 30.

In reading the state of the memory cell 30, an electrical potential $V_r$ is applied across the memory cell 30 from a higher to a lower electrical potential in the same direction as the electrical potential $V_{pg}$. This electrical potential is less than the electrical potential $V_{pg}$ applied across the memory cell 30 for programming (see above). In this situation, if the memory cell 30 is programmed, the memory cell 30 will readily conduct current, indicating that the memory cell 30 is in its programmed state. If the memory cell 30 is not programmed, the memory cell 30 will not conduct current, indicating that the memory cell 30 is in its erased state.

Figure 2:
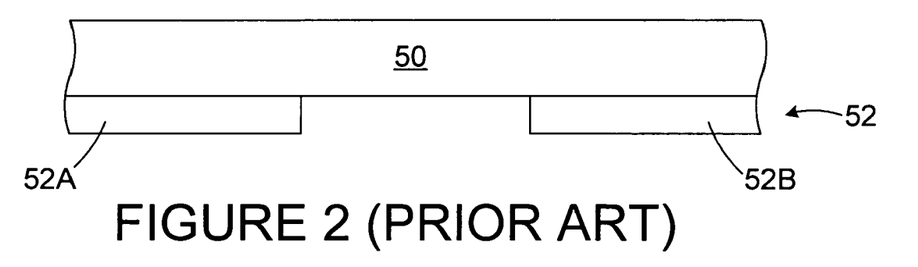
FIGS. 2–14 illustrate the prior method for forming the subject electronic device.
Figure 3:
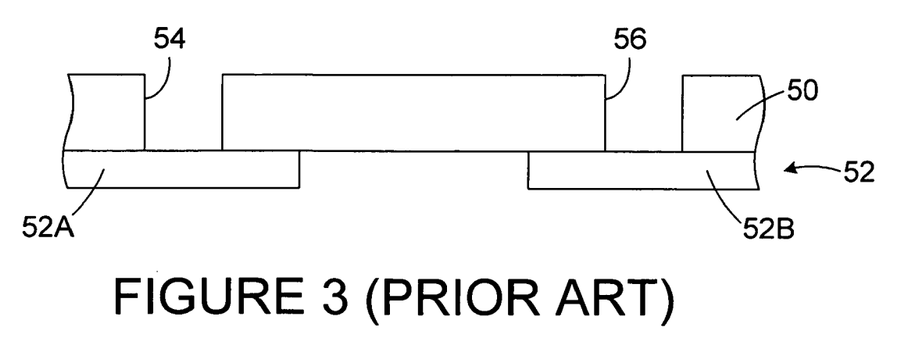
Figure 4:
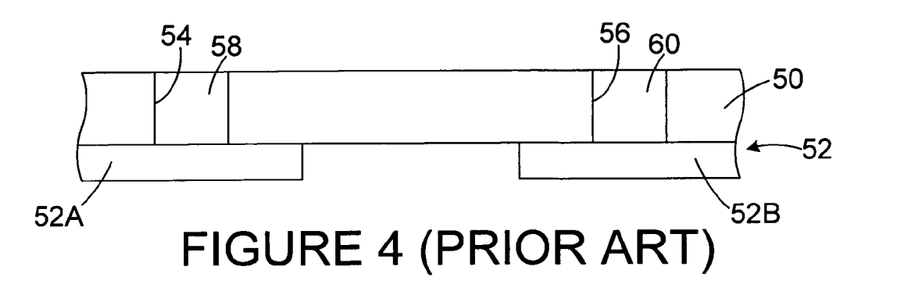

FIGS. 2–14 illustrate a process for forming such memory cells along with conductive bodies or plugs in an electronic structure. Initially, and with reference to FIG. 2, a dielectric layer 50 is formed over and on a conductive metal layer 52, for example copper, the metal layer 52 having been patterned into metal lines 52A, 52B as shown. Using standard lithographic techniques, via openings 54, 56 are formed in and through the dielectric layer 50 over the metal lines 52A, 52B, communicating with the metal lines 52A, 52B respectively (FIG. 3). Next (FIG. 4), the openings 54, 56 are filled with conductive material (for example copper) to form copper bodies 58, 60 in the respective openings 54, 56, which copper bodies 58, 60 contact the respective metal lines 52A, 52B of the layer 52.

Figure 5:
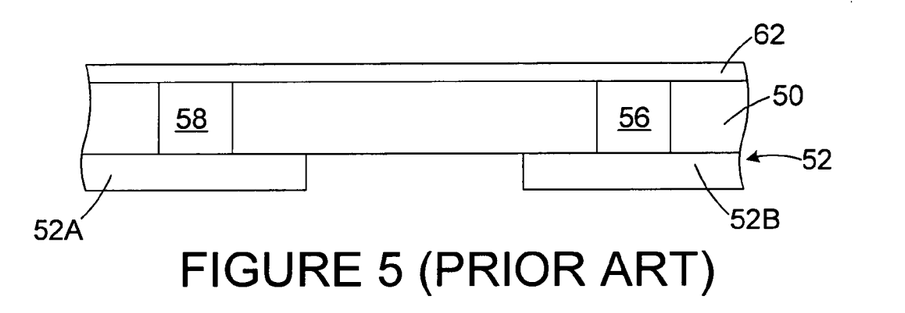
Figure 6:
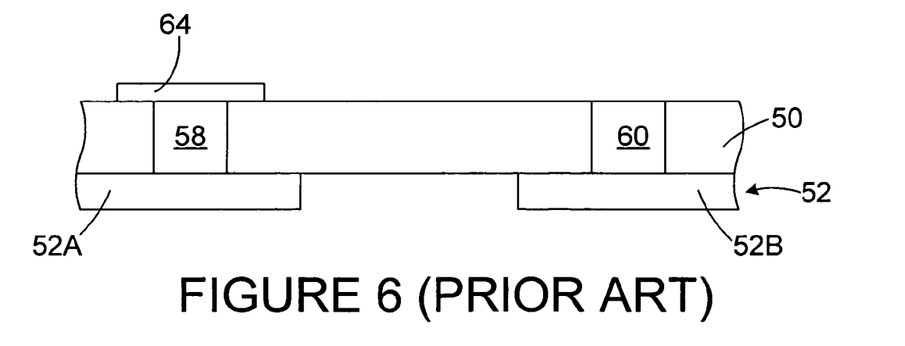
Figure 7:
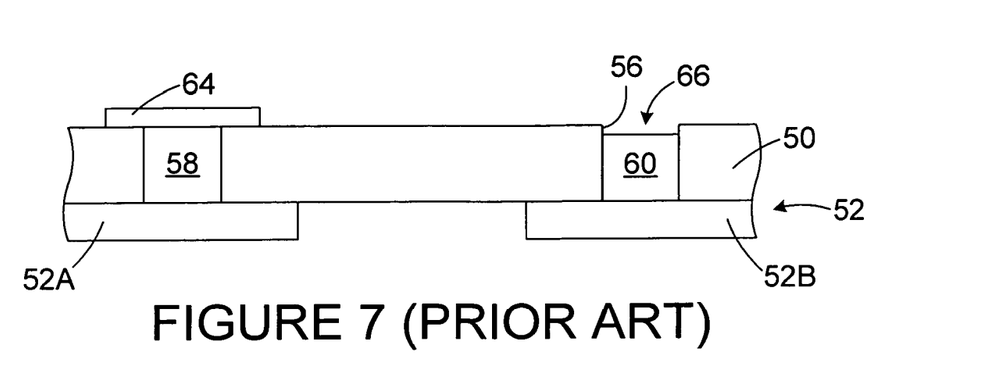
Figure 8:
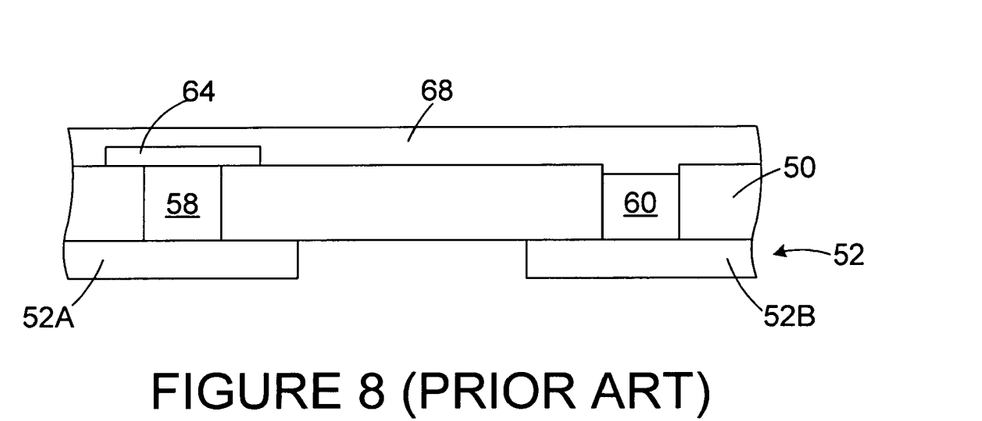

A hard mask 62, for example silicon nitride, is formed over and on the upper surface of the resulting structure, i.e., over the upper surfaces of the copper bodies 58, 60 and the dielectric layer 50 by any suitable method (FIG. 5). Using standard lithographic techniques, portions of the hard mask 62 are removed to provide a remaining hard mask portion 64 overlying the copper body 58 but leaving the copper body 60 exposed (FIG. 6). Next, with reference to FIG. 7, the top surface of the copper body 60 is etched to form a recess 66 within the opening 56, the copper body 58 being protected therefrom by the hard mask portion 64 thereover.

Figure 9:
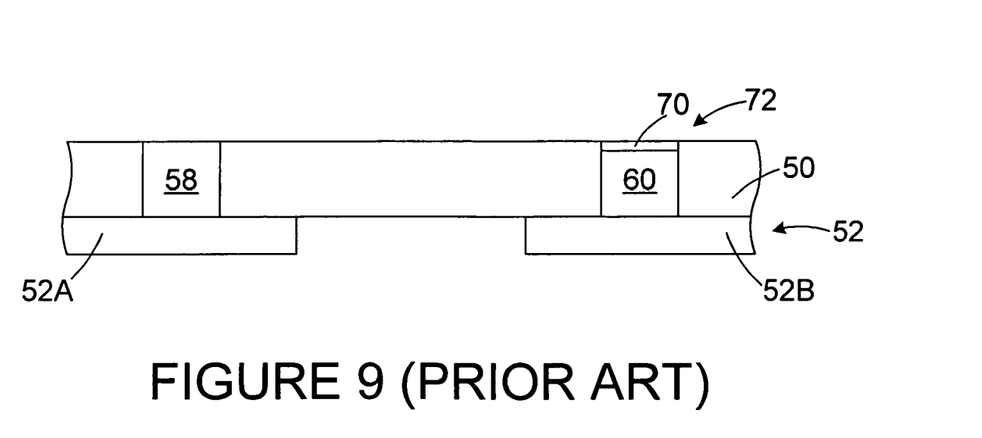

A tantalum-containing layer 68 is deposited over and on the resulting structure (FIG. 8), i.e., over and on the exposed portions of the dielectric 50, the hard mask portion 64, and the copper body 60, filling in the recess 66 formed in the previous step. A polishing step then undertaken to remove all of the layer 68 except that portion 70 in the recess 66, and to remove the hard mask portion 64, leaving a cap 70 over the copper body 60 so as to form a conductive body 72 including the copper body 60 and cap 70 on and over the copper body 60, and planarizing the overall structure (FIG. 9). The copper body 58 itself forms a conductive body.

Figure 10:
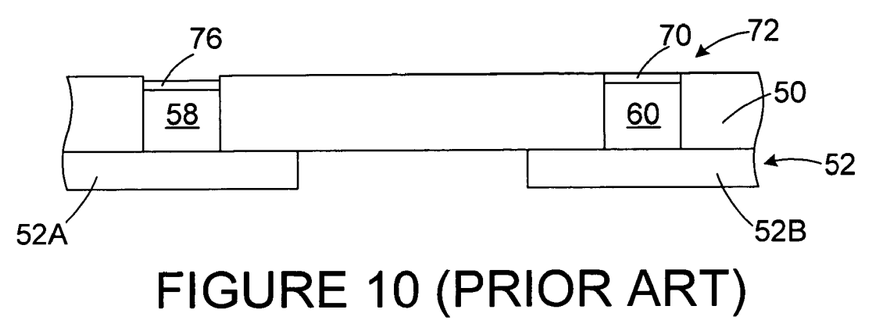
Figure 11:
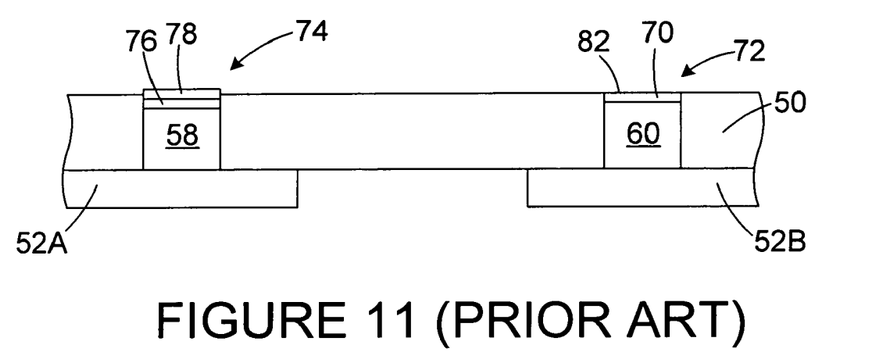

With reference to FIGS. 10 and 11, a memory structure 74 is formed over the copper body 58. In furtherance thereof, a passive layer 76 (FIG. 10), for example, $Cu_2S_2$, may be formed using sulfidation techniques, gas phase reactions, implantation, deposition, or any other suitable technique. This results in the passive layer 76 being on the copper body 58. As illustrated in FIG. 11, an active layer 78, which may be organic or inorganic material, is formed on and over the passive layer 76 by any suitable technique, including, for example, spin on techniques, chemical vapor deposition, and the like.

Figure 12:
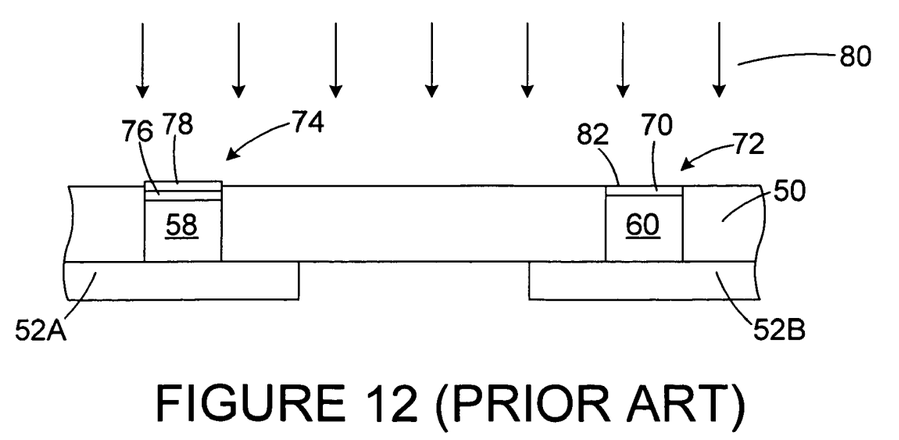
Figure 13:
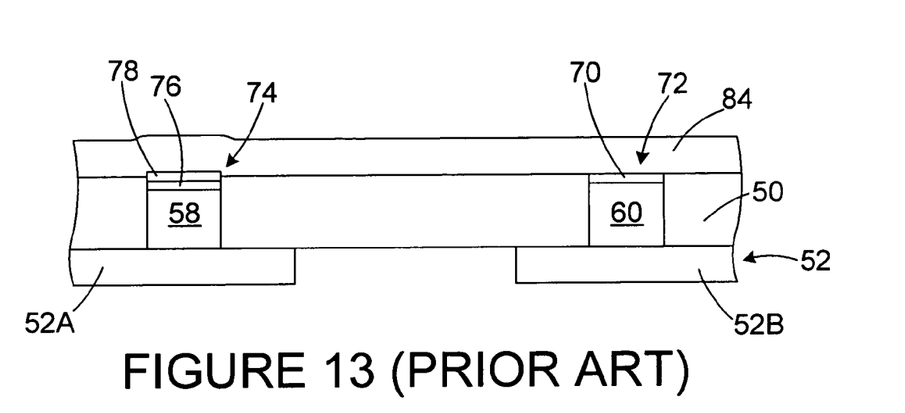
Figure 14:
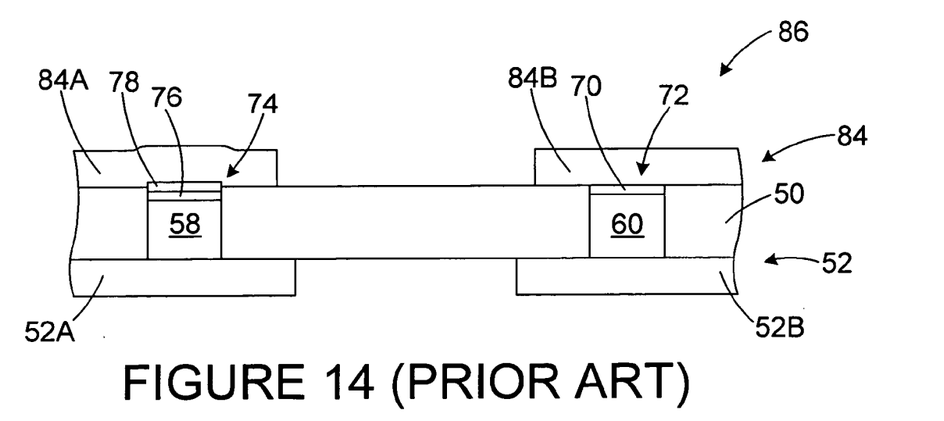

Prior to providing connections to the conductive body 72 and the active layer 78, a cleaning step 80 is undertaken to remove native oxide 82 which has formed on the conductive body 72 by contact with the air (FIG. 12). This is done to ensure that a conductive layer formed on and over the structure will provide proper ohmic contact with the conductive body 72. This step of removal oxidation may be achieved by argon sputter etching, which forcefully removes the oxide 82 from the exposed cap 70 of the conductive body 72. Next, a conductive metal layer 84, for example, aluminum, is provided on and over the resulting structure (FIG. 13), and is patterned (using standard lithographic techniques) into metal lines 84A, 84B, metal line 84A being on and over the active layer 78 and over the memory structure 74, and metal line 84B being on and over the conductive body 72 (FIG. 14). The steps thus far shown and described form the overall electronic structure 86. The conductive body 58, passive layer 76, active layer 78, and metal line 84A make up the memory cell as previously shown and described, and the conductive body 72 forms an interconnect between the metal line 52B and metal line 84B.

The cleaning step as illustrated and described has been found necessary for providing proper ohmic contact between the conductive layer 84 and the conductive body 72. However, this process for removal of oxidation 82 from the conductive body 72, involving relatively violent physical bombardment of the oxide 82, is undertaken with the active layer 78 of the memory structure 72 exposed. This aggressive cleaning process, while effective in removing the oxide 82, may well damage the exposed active layer 78, degrading the performance of the completed memory cell or rendering it inoperative.

Therefore, what is needed is an approach wherein proper removal of surface oxidation from selected conductive bodies is achieved, meanwhile avoiding damage to the memory structure.

DISCLOSURE OF THE INVENTION

Broadly stated, the present invention is a method of fabricating an electronic structure comprising the steps of providing a conductive layer, providing a dielectric layer over the conductive layer, providing first and second openings through the dielectric layer, providing first and second conductive bodies in the first and second openings respectively and in contact with the conductive layer, providing a memory structure over the first conductive body, providing a protective element over the memory structure, and undertaking processing on the second conductive body. In another aspect of the invention, an electronic structure comprises a dielectric layer having first and second openings therein, first and second conductive bodies in the first and second openings respectively, a memory structure over the first body and comprising (a) a passive layer on the first body and (b) an active layer on the passive layer, and a protective element comprising titanium and/or titanium nitride over the memory structure and not over the second conductive body.

The present invention is better understood upon consideration of the detailed description below, in conjunction with the accompanying drawings. As will become readily apparent to those skilled in the art from the following description, there is shown and described (an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 15:
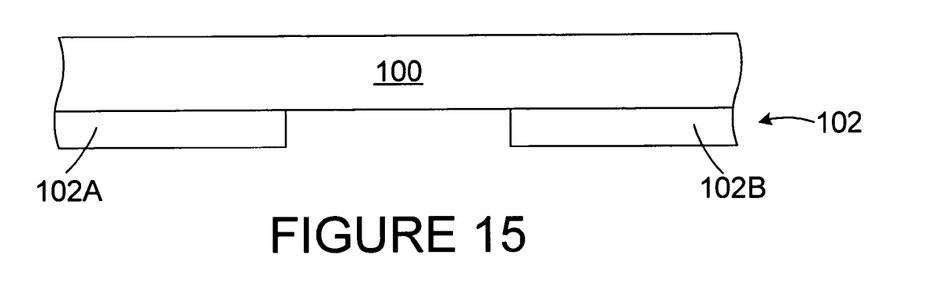
FIGS. 15–29 illustrate the present method for forming the subject electronic device.
Figure 16:
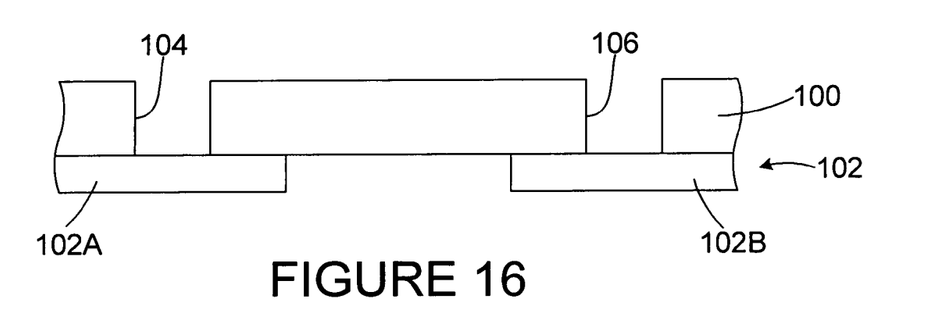
Figure 17:
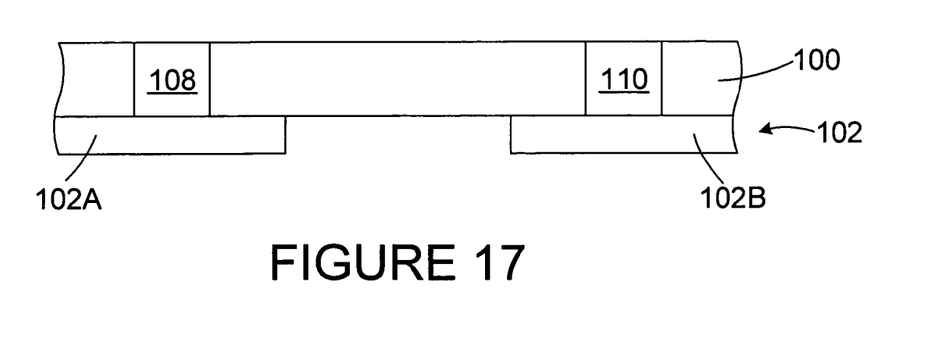

FIGS. 15–29 illustrate the present process for forming memory cells along with conductive bodies or plugs in an electronic structure. FIGS. 15–24 illustrate steps similar to those shown and described above with regard to FIGS. 2–11. That is, a dielectric layer 100 is formed over and on a conductive metal layer 102, for example copper, the metal layer 102 having been patterned into metal lines 102A, 102B as shown (FIG. 15). Using standard lithographic techniques, via openings 104, 106 are formed in and through the dielectric layer 100 over the respective metal lines 102A, 102B, communicating with the metal lines 102A, 102B respectively (FIG. 16). Next, (FIG. 17), the openings 104, 106 are filled with conductive material (for example copper) to form copper bodies 108, 110 in the respective openings 104, 106, which copper bodies 108, 110 contact the respective metal lines 102A, 102B of the layer 102.

Figure 18:
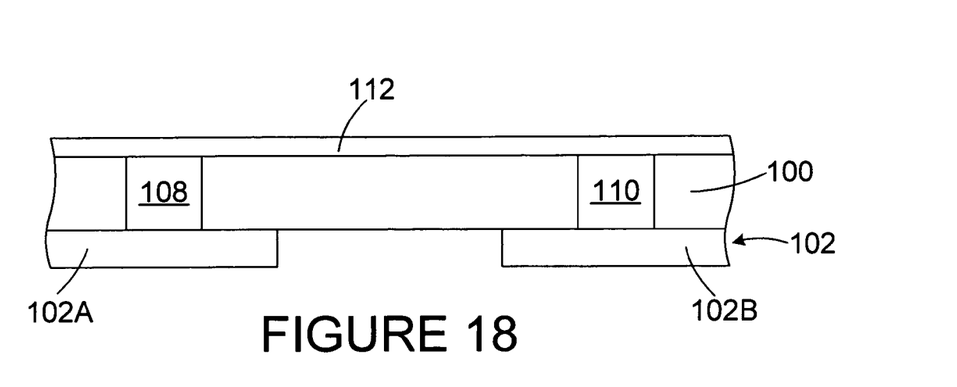
Figure 19:
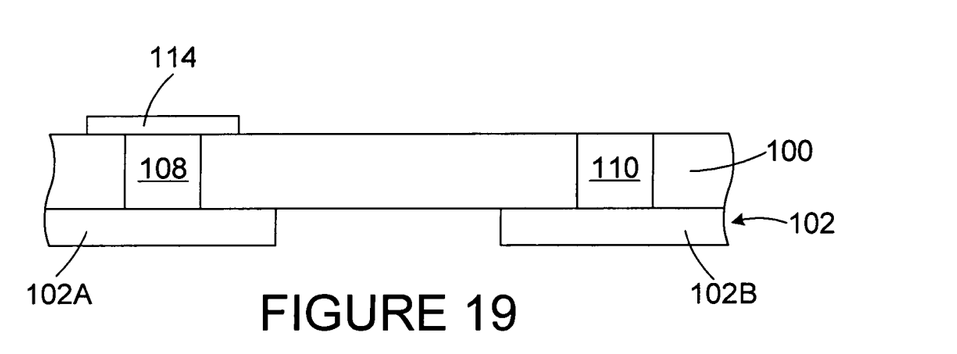
Figure 20:
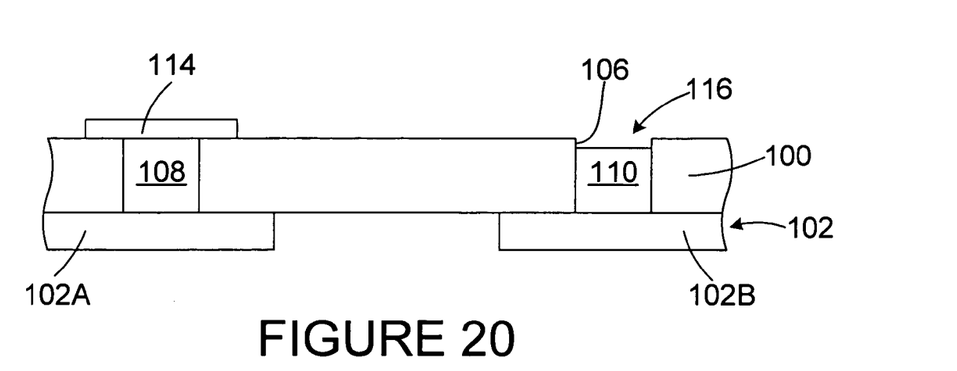
Figure 21:
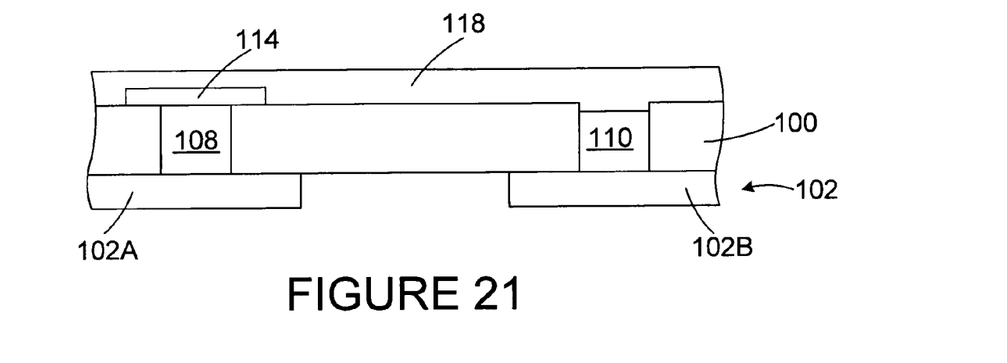

A hard mask 112, for example silicon nitride, is formed over and on the upper surface of the resulting structure, i.e., over the upper surfaces of the copper bodies 108, 110 and the dielectric layer 100 by any suitable method (FIG. 18). Using standard lithographic techniques, portions of the hard mask 112 are removed to provide a remaining hard mask portion 114 overlying the copper body 108 but leaving the copper body 110 exposed (FIG. 19). Next, with reference to FIG. 20, an etch step is undertaken on the top surface of the copper body 110 to form a recess 116 within the opening 106, the copper body 108 being protected therefrom by the hard mask portion 114 thereover.

Figure 22:
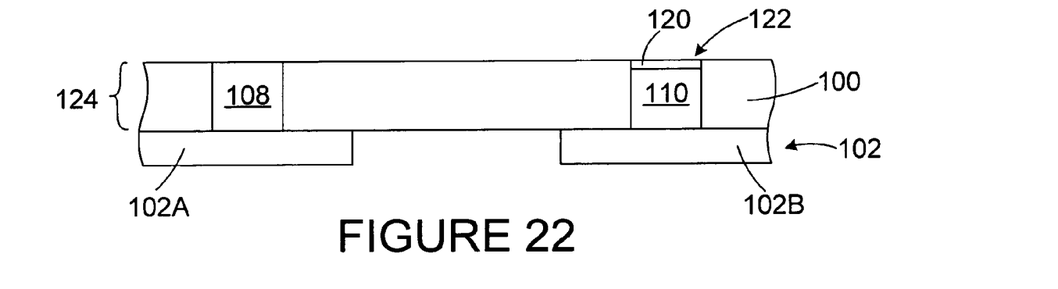

A tantalum-containing layer 118 is deposited over and on the resulting structure (FIG. 21), i.e., over and on the exposed portions of the dielectric 100, the hard mask portion 114, and the copper body 110, filling in the recess 116 formed in the previous step. A polishing step then undertaken to remove all of the layer 118 except that portion 120 in the recess 116, and to remove the hard mask portion 114, leaving a cap 120 over the copper body 110 so as to form a conductive body 122 including the copper body 110 and cap 120 on and over the copper body 110, and planarizing the overall structure (FIG. 22). The copper body 108 itself forms a conductive body. The dielectric layer 100 and conductive bodies 108, 122 make up a base structure 124.

Figure 23:
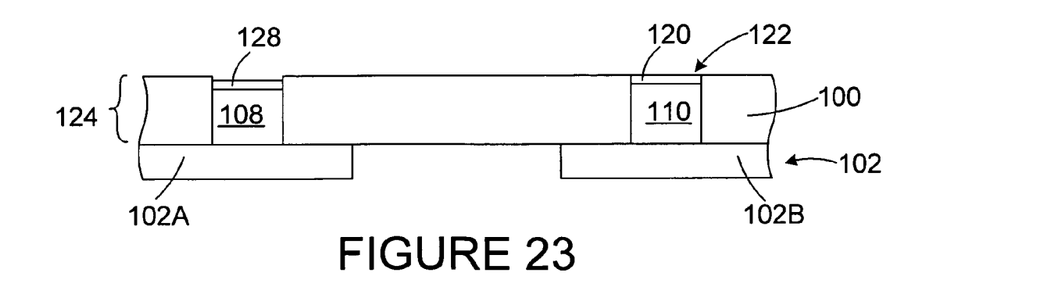
Figure 24:
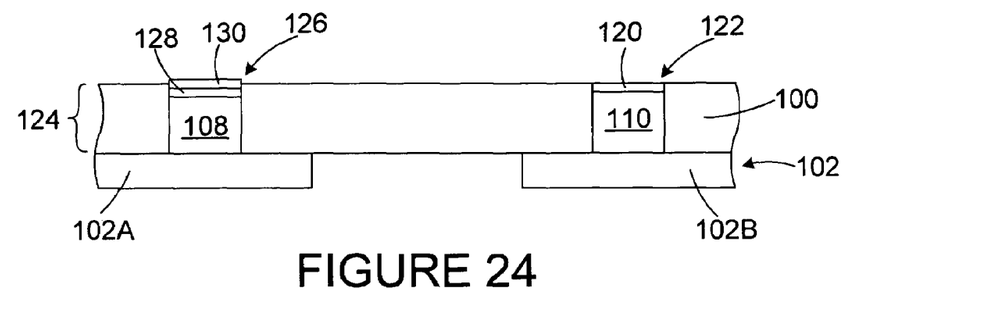

With reference to FIGS. 23 and 24, a memory structure 126 is formed over the copper body 108. In furtherance thereof, a passive layer 128 (FIG. 23), for example, $Cu_2S$, may be formed using sulfidation techniques, gas phase reactions, implantation, deposition, or any other suitable technique. This results in the passive layer 128 being on and over the copper body 108. As illustrated in FIG. 24, an active layer 130, which may be organic or inorganic material, is formed on and over the passive layer 128 by any suitable technique, including, for example, spin on techniques, chemical vapor deposition, and the like.

Figure 25:
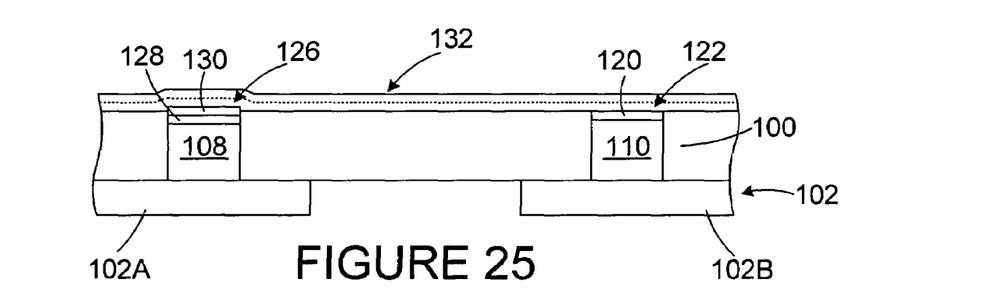

Next, and with reference to FIG. 25, instead of undertaking at this point the oxidation removal or cleaning step as previously shown and described, a titanium-containing metal layer 132 such as titanium and/or titanium nitride is provided over the resulting structure. Formation of a bilayer titanium/titanium nitride metal film is undertaken as follows. Physical vapor deposition (PVD) is undertaken via sputtering from a titanium target in UHV or $N_2$ ambient. Processing tools typically used in the semiconductor industry for this technique use either a Self-Ionized Plasma (SIP) or Hollow Cathode Magnetron (HCM) source. A cluster tool configuration allows for wafer bake-degassing, predeposition Ar sputter etching, and metal sputter-deposition without breaking vacuum. The preferred process sequence is: degas the substrate at a reduced temperature (~150 C., 45 sec), transfer to deposition chamber, preheat (~150 C., 10 sec, Ar 65 sccm), deposit titanium (~150 C., 38 sec, Ar 65 sccm, DC power 500 W), deposit titanium nitride (~150 C., 29 sec, Ar 85 sccm/N2 90 sccm, DC power 7600 W), evacuate (~150 C., 5 sec) and cooldown. This process would typically produce a bi-layered film of Ti(150 angstroms)/TiN(600 angstroms). By intentionally not performing an Ar predeposition sputter etch in this sequence and maintaining a low wafer temperature, the active layer exposed on the wafer surface is preserved.

Figure 26:
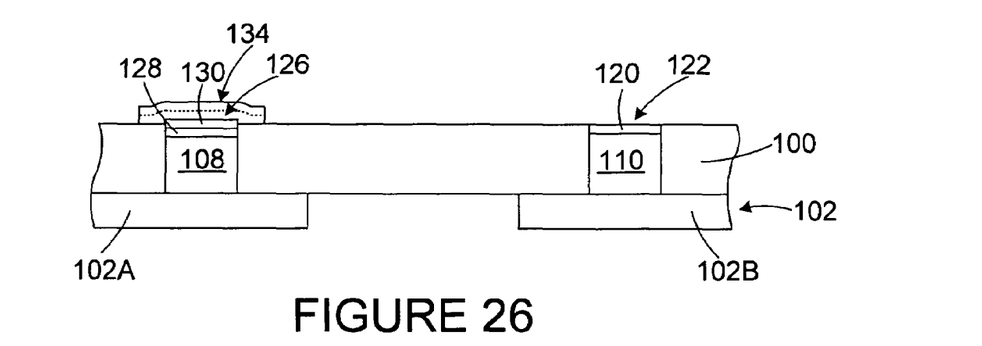
Figure 27:
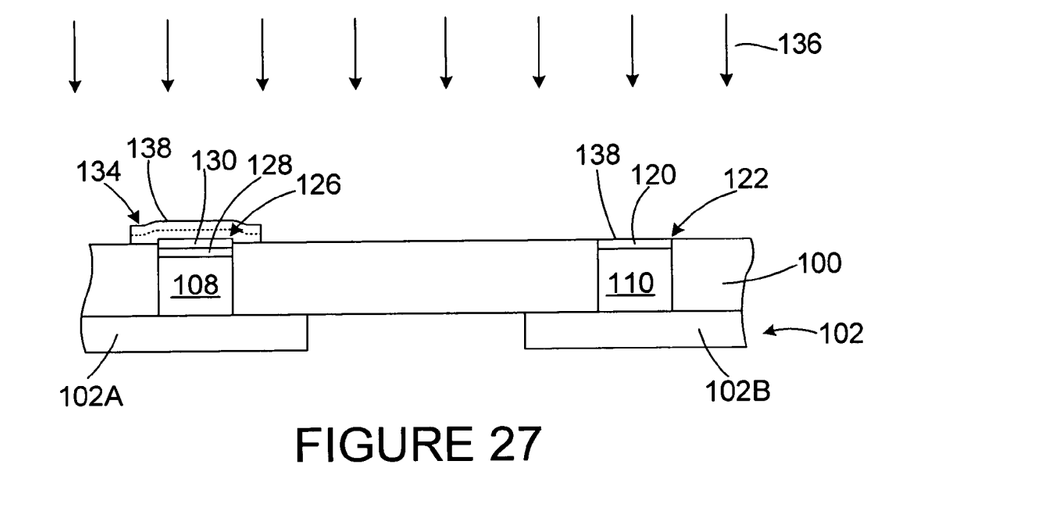
Figure 28:
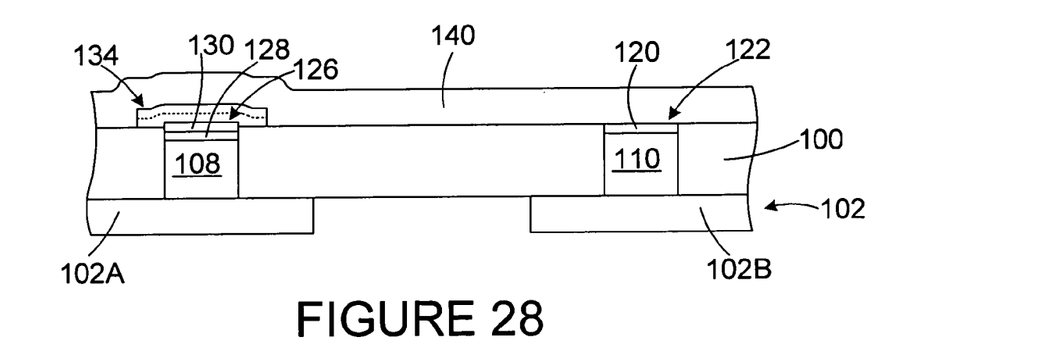

Using standard photoresist patterning technology, portions of the titanium-containing metal layer are removed, leaving a titanium-containing element 134 over and on the active layer 130 (FIG. 26). Then, with this protective layer 134 overlying the active layer 130, the oxidation removal, i.e., cleaning step as described above is undertaken (FIG. 27). That is, for example, argon sputter etching 136 is undertaken, which physically and forcefully removes the oxide 138 from the exposed cap 120 of the conductive body 122, and from the exposed protective layer 134. The layer 134 protects the active layer 130 from this bombardment so that while proper cleaning of the conductive body 122 and layer 134 is achieved, assuring proper ohmic contact with a subsequently-applied conductive layer, the active layer 130 is not damaged during this process.

Figure 29:
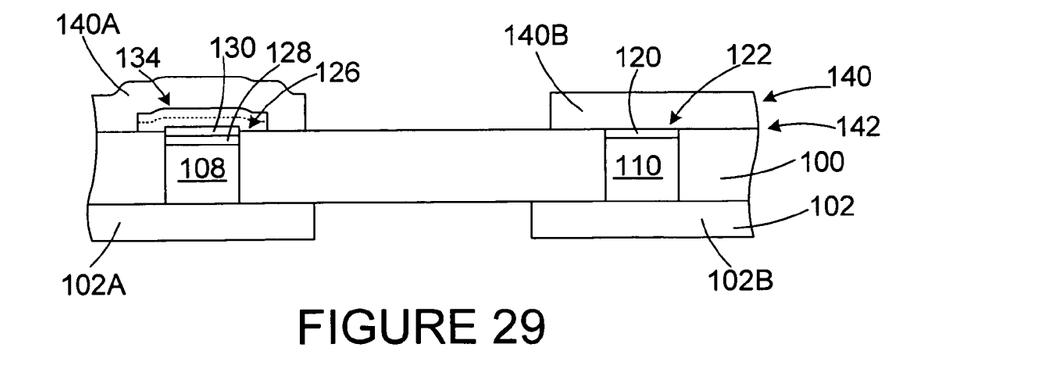

Then, as previously shown and described, a conductive metal layer 140, for example an aluminum containing layer (for example a Ti/TiN/Al(0.5% Cu)/TiN stack is provided on and over the resulting structure (FIG. 28), and is patterned (using standard lithographic techniques) into metal lines 140A, 140B, metal line 140A being on and over the protective layer 134 and over the memory structure 126, and metal line 140B being on and over the conductive body 122 (FIG. 29). The steps thus far shown and described form the overall electronic structure 142. The conductive body 108, passive layer 128, active layer 130, and layer 134 make up the memory cell as previously shown and described, and the conductive body 122 forms an interconnect between the metal line 102B and metal line 140B.

It will be seen that here is provided an approach wherein the step of removing oxidation from a conductive body is achieved without damage to any part of the memory cell. This approach is simple yet highly effective in achieving this goal.

The foregoing description of the embodiment of the invention has been presented for purposes of illustration and description. It is not intended to be exhaustive or to limit the invention to the precise form disclosed. Other modifications or variations are possible in light of the above teachings. The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fabricating an electronic structure comprising:
    providing a base structure;
    providing a memory structure over a portion of the base structure;
    providing a protective element over the memory structure; and
    undertaking processing on the base structure in a region thereof not under the protective element, wherein the protective element comprises conductive material.

2. The method of claim 1 wherein the protective element comprises titanium.

3. The method of claim 1 wherein processing on the base structure comprises a cleaning process.

4. The method of claim 3 wherein the memory structure comprises a first memory structure layer, and a second, active memory structure layer on the first memory structure layer.

5. A method of fabricating an electronic structure comprising:
    providing a layer having first and second openings therein;
    providing first and second bodies in the first and second openings respectively;
    providing a memory structure over the first body;
    providing a protective element over the memory structure; and
    undertaking processing on the second body with the protective element over the memory structure;
    wherein the protective element comprises conductive material.

6. The method of claim 5 wherein the memory structure comprises a first memory structure layer and a second memory structure layer.

7. The method of claim 6 wherein the first memory structure layer is on the first body, and the second memory structure layer is on the first memory structure layer.

8. The method of claim 7 wherein the first memory structure layer is a passive layer, and the second memory structure layer is an active layer.

9. The method of claim 5 wherein each of the first and second bodies comprises conductive material.

10. The method of claim 9 wherein the protective element comprises metal, and wherein each of the first and second bodies comprises metal.

11. The method of claim 5 wherein the protective element comprises titanium.

12. The method of claim 10 wherein the protective element comprises titanium.

13. The method of claim 12 wherein the layer having first and second openings therein comprises a dielectric layer.

14. The method of claim 8 wherein processing on the second body comprises a cleaning process.

15. The method of claim 14 and further comprising providing a conductive layer over the resulting structure.

* * * * *